United States Patent [19]

Roberts

[11] Patent Number: 4,958,091
[45] Date of Patent: Sep. 18, 1990

[54] CMOS VOLTAGE CONVERTER

[75] Inventor: Gregory N. Roberts, Boise, Id.

[73] Assignee: Micron Technology, Inc., Boise, Id.

[21] Appl. No.: 202,962

[22] Filed: Jun. 6, 1988

[51] Int. Cl.$^5$ .................. H03K 19/20; H03K 17/687
[52] U.S. Cl. ................................ 307/451; 307/452; 307/571; 307/585; 307/475
[58] Field of Search ............... 307/450, 451, 475, 452, 307/453, 571, 579, 585, 270

[56] References Cited

U.S. PATENT DOCUMENTS

| | | | |
|---|---|---|---|
| 4,284,905 | 8/1981 | Rosenzweig | 307/482 |
| 4,486,670 | 12/1984 | Chan et al. | 307/279 |
| 4,616,143 | 10/1986 | Miyamoto | 307/482 |
| 4,763,023 | 8/1988 | Spence | 307/451 |

Primary Examiner—Stanley D. Miller
Assistant Examiner—Trong Phan
Attorney, Agent, or Firm—Stanley N. Protigal; Angus C. Fox, III; Jon P. Busack

[57] ABSTRACT

A voltage level conversion circuit which may be used on CMOS integrated circuit semiconductor devices uses a regulated power supply to drive an internal array and periphery logic. The voltage converter includes a first inverter (31), an isolating transistor (Q3), and an output inverter (35). An isolating transistor (Q3) admits current to the output inverter (35) until the output inverter (35) switches its output level. An active biasing circuit, including transistor Q4, causes inverter (35) to remain at a low state after the isolating transistor (Q3) gates off, thereby allowing the output inverter to continue to provide its output in isolation from the first inverter's output voltage.

8 Claims, 4 Drawing Sheets

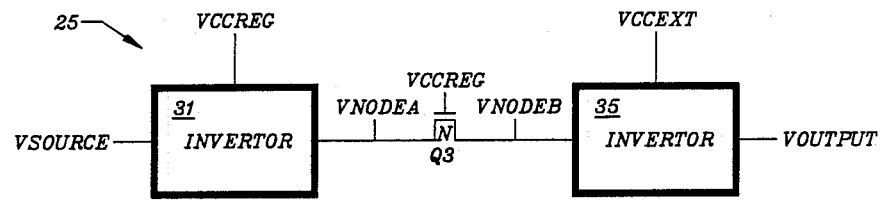
Fig.4
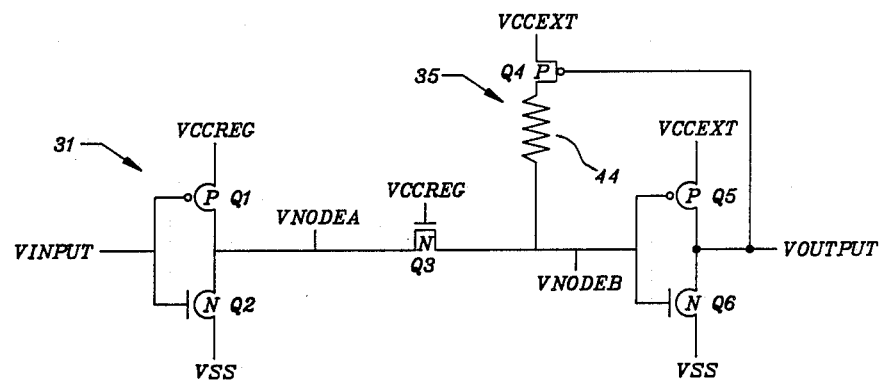
Fig.5
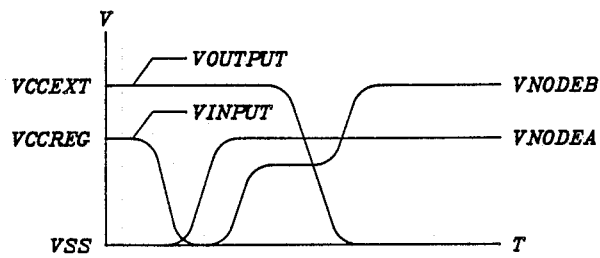
Fig.6.1

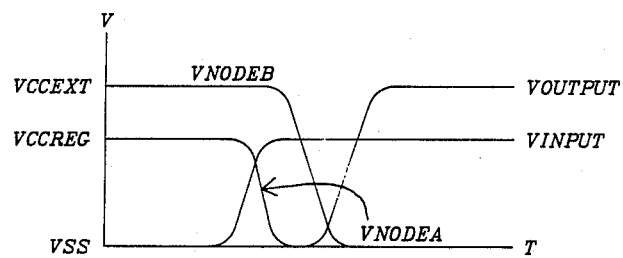
Fig.6.2
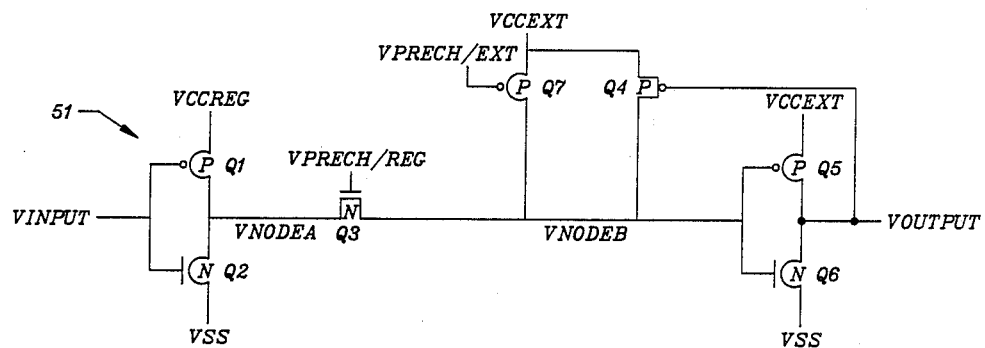
Fig.7
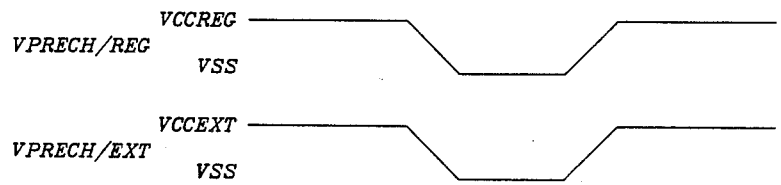
Fig.8

CMOS VOLTAGE CONVERTER

FIELD OF THE INVENTION

This invention relates to semiconductor devices. More specifically the invention relates to a voltage level conversion circuit which may be used on CMOS integrated circuit semiconductor devices, including random access memories.

BACKGROUND OF THE INVENTION

One result of shrinking semiconductor technology is that the external, supplied voltage must be reduced in tandem to optimize circuit performance. Several semiconductor chips are using a regulated voltage to drive the internal circuitry. Therefore, the design engineer must ultimately translate between these two different voltage levels. This invention is directed to solving this voltage conversion problem. The solution is intended to provide an approach which consumes little power, is fast, and relatively simple to implement.

SUMMARY OF THE INVENTION

One circuit which uses a regulated internal voltage is a FIFO (First-In, First-Out) memory device. The FIFO utilizes a regulated $V_{cc}$ power supply, $V_{ccreg}$, to drive the internal array and periphery logic. The $V_{cc}$ voltage is approximately 4 volts nominal. The external, supplied power supply, $V_{ccext}$ is 5 volts nominal.

The source of an output signal is created in the internal logic which operates at $V_{ccreg}$ voltage, but this signal must be converted to the $V_{ccext}$ voltage to drive the output buffer which interfaces to the external world. If $V_{Node\ 1}$ is driven to $V_{ccreg}$, then DC power is consumed through Q3. Referring to FIG. 2, if $V_{in}$ were $V_{ccext}$ then Q3 would be "off" and no DC power would be consumed.

DESCRIPTION OF THE DRAWINGS

FIGS. 4 and 5 are circuit diagrams of the present invention in accordance with a first embodiment;

FIG. 6.1 and 6.2 show the operational modes of the circuit of FIGS. 4 and 5 in terms of voltages (EMF) over time;

FIG. 7 shows an alternate embodiment of the present invention;

FIG. 8 shows the operation of the circuit of FIG. 7 in terms of operating voltages over time.

DETAILED DESCRIPTION OF THE PREFERRED EMBODIMENTS

Figure 1:
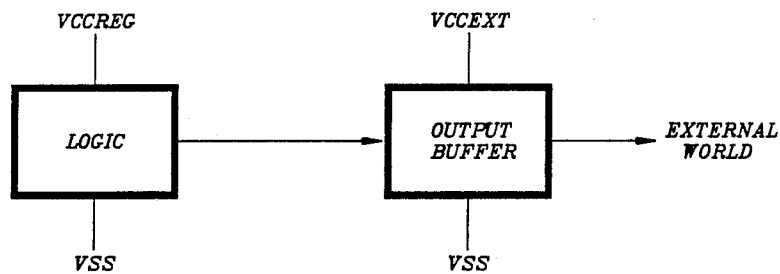
FIG. 1 is a block diagram representation of a voltage converter for input data.
Figure 2:
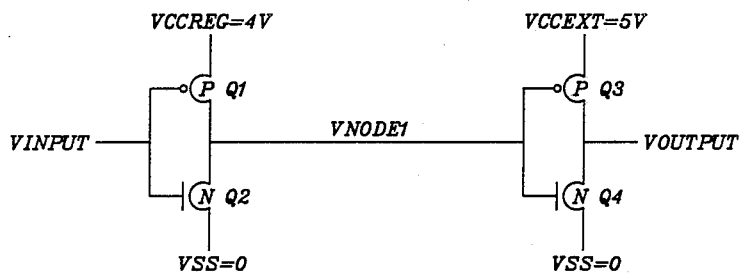
FIG. 2 schematically shows the use of a pair of inverters to provide the function of the circuit of FIG. 1.
Figure 3:
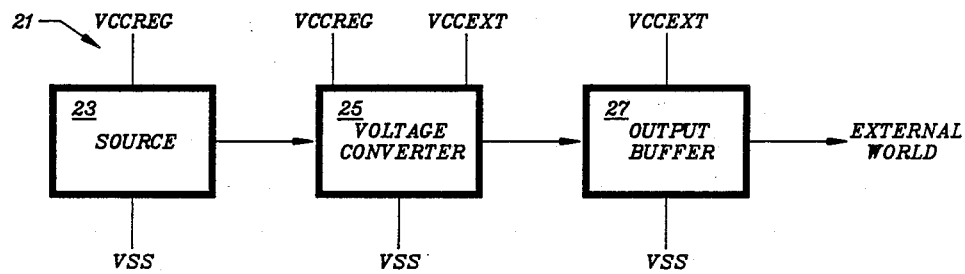
FIG. 3 is a block diagram showing the operating units of a preferred embodiment of the present invention.

FIG. 3 gives a general overview of the converter 21 which allows for several different configurations of standard digital logic in both the source circuitry and the conversion circuitry. An input signal source 23, operating at $V_{ccreg}$ provides an output signal to a voltage converter 25, which provides a stepped up voltage to an output buffer 27. The voltage converter 25 receives in external voltage (EMF) which is typically 5 volts nominal, and it enables the signal provided to the output buffer 27, to be provided at signal levels corresponding to the $V_{ccext}$.

Referring to FIGS. 4 and 5, the voltage converter 25 includes a first inverter 31, an isolating transistor Q3, and an output inverter 35. The first inverter 31 consists of a pair of transistors Q1, Q2 which have a normal P/N ratio, of approximately 2. This results in voltage at Node A reaching levels at which would normally not exceed $V_{ccreg}$. As a practical matter, the voltages at Node A switch between the $V_{ccreg}$ and $V_{ss}$. Isolating Transistor Q3 has its gate at the $V_{ccreg}$, therefore if the voltage at Node A is at a high state ($V_{ccreg}$) Q3 is turned off and does not conduct. This would result in the voltage at Node B going to a quiescent value which is affected by an active biasing circuit, including transistor Q4, and will be described.

Transistors Q1 and Q2 create a standard CMOS inverter that outputs at $V_{ccreg}$. Node A has a voltage range from $V_{ss}$ (logic "0") to $V_{ccreg}$ (logic "1"). Transistor Q3 is an n-channel pass transistor that performs the core of the conversion process, and its gate voltage is always tied to $V_{ccreg}$. Transistor Q4 is a p-channel transistor whose source voltage is $V_{ccext}$ and is gated by $V_{out}$. Transistors Q5 and Q6 create a standard CMOS inverter that is tied to $V_{ccext}$ and its output is $V_{out}$.

When the output of signal inverter 31 is low ($V_{Node\ A} = V_{ss}$), Q3 conducts, causing the $V_{NodeB}$ to drop to $V_{ss}$, and thereby causing transistor Q5 to conduct and Q6 to gate off. This results in a high level output from the output inverter 35, at voltage of $V_{ccext}$. Transistor Q4 is gated off in response to the high level output.

When the output of signal inverter 31 is high ($V_{Node\ A} = V_{ccreg}$), Q3 initially conducts, causing the $V_{NodeB}$ to rise to ($V_{ccreg} - VT$), and thereby causing transistor Q6 to conduct to $V_{ss}$ and Q5 to gate off. Isolating Transistor Q3 will then gate off as $V_{Node\ B}$ increases to ($V_{ccreg} - VT$). As noted before, the output inverter 35 has an active biasing circuit which includes Q4. The active biasing circuit causes inverter 35 to remain on after Q3 gates off. This is because, if the $V_{out}$ is low, Q4 is gates on, thereby bringing Node B to $V_{ccext}$ and holding the output of the output inverter 35 low.

It is necessary that Node B brought to the transition voltage of the inverter 35 in order that this condition ($V_{out}$ is low) be established in the first place.

The operation of the conversion process is shown in FIGS. 6, which show the following operating conditions:

| CONDITION 1: | | | |
|---|---|---|---|
| $V_{in}$ going to 0V | $V_{Node\ A}$ going to $V_{ccreg}$ | $V_{Node\ B} = V_{ss}$ going to $V_{ccext}$ | $V_{out} = V_{ccext}$ going to $V_{ss}$ |
| CONDITION 2: | | | |
| $V_{in}$ going to $V_{ccreg}$ | $V_{Node\ A}$ going to $V_{ss}$ | $V_{Node\ B} = V_{ccext}$ going to $V_{cc}$ | $V_{out} = V_{ccext}$ going to $V_{ss}$ |

Because $V_{Node\ B}$ is driven to ($V_{ccreg} - VT$) by Transistor Q3 during condition 1, the CMOS inverter 35 created by Transistors Q5 and Q6 are being driven by a non-digital signal (since $V_{Node\ B}$ is neither $V_{ss}$ nor $V_{ccext}$). Therefore, to assist Transistor Q6 to completely pull V out low, it is advisable to increase the transistor gate width of Transistor Q6. As an example, a normal P/N ratio of gate widths in a standard CMOS inverter for Q5/Q6 would be 2. So typically Transistor Q5 would be designed to have a gate width of 20 microns and Transistor Q6 would have a gate width of 10 microns. In this CMOS voltage converter, Q5 would have a gate width=20 microns and Q6 will have a gate width=25 microns.

The inverter 35 has a P/N ratio which is intended to control the transition voltage of the inverter in favor of the switching by $V_{ccreg}$ voltage output of the signal inverter 31 (conducted through Isolating Transistor Q3). The P/N ratio controls the inverter's transition voltage and is sometimes referred to as the "trip point" of the inverter. A standard configuration of the inverter is that the P/N ratio is equal to 2, so that the transition voltage of the P Transistor, Q1 or Q5, would be twice that of the transition voltage of the N transistor (Q2 or Q6). In the output inverter 35, the P/N ratio is set lower, for example, at approximately 0.8. This allows the inverter 35 to respond to relatively low levels of Node B when $V_{Node\ B}$ is following the $V_{Node\ A}$.

Referring to FIG. 5, typical device sizes are:
Q1 W=20; L=1.2
Q4 W=5; L=1.6
Q2 W=10; L=1.2
Q5 W=20; L=1.6
Q3 W=20; L=1.6
Q6 W=25; L=1.6

Referring to FIG. 6.1, $V_{ccreg}$ is lower than $V_{ccext}$. If the $V_{Node\ A}$ goes from a low state to a high state, that value ($V_{Node\ A}$) will reach a maximum of $V_{ccreg}$. $V_{Node\ B}$ will begin to follow $V_{Node\ A}$ because Q3 is gated open. During this time period in which Q3 is open, Q5 gates off, and Q6 gates on, causing the output of the inverter 35 to go low. The low output causes biasing transistor Q4 to conduct, thereby maintaining $V_{Node\ B}$ at a level of close to $V_{ccext}$, as shown on the right side of FIG. 6.1. This high level of Node B is greater than the transition voltage of the inverter 35, thereby maintaining the output level of the inverter 35 at a low state, also as shown on the right side of FIG. 6.1. With transistor Q3 in an off state, $V_{Node\ A}$ may be different from $V_{Node\ B}$ without significant current conduction losses.

Referring to FIG. 6.2, when the $V_{Node\ A}$ goes to a low state, Isolating Transistor Q3 is caused to conduct. The parameters of transistor Q4, represented for purposes of this explanation as resistance 44, are such that the $V_{Node\ B}$ is able to follow the voltage at Node A and therefore drop. Once the current voltage $V_{Node\ B}$ drops below the transition voltage of the output inverter 35, the output of inverter 35 goes high and transistor Q4 is gated off, maintaining the high output from the inverter 35, as shown on the right side of FIG. 6.2.

FIG. 7 is similar to the circuit of FIG. 5, but with the addition of a precharge transistor Q7. If synchronous circuitry is employed, then external and regulated precharge signals, $V_{prechext}$ and $V_{prechreg}$ can be provided by a clocking circuit. Isolating Transistor Q3 is gated by $V_{prechreg}$ and is therefore controlled by the relationship of $V_{Node\ A}$ and $V_{prechreg}$. $V_{Node\ B}$ can be precharged to $V_{ccext}$ by Transistor Q7 during the clock inactive cycle (when $V_{prechreg}$ and $V_{prechext}$ are at $V_{ss}$) and Transistor Q3 is off. As shown in FIG. 8, this circuit is faster than that shown in FIG. 5 since $V_{Node\ B}$ is precharged to $V_{cext}$ rather than being driven high through Transistor Q3.

Figure 9:
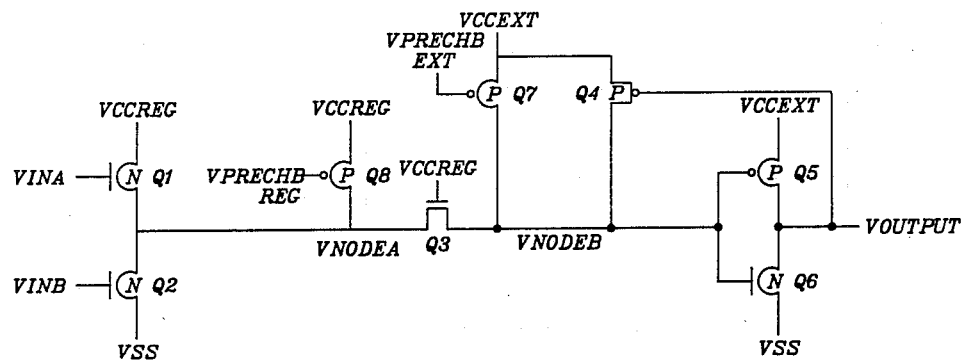
FIG. 9 shows another embodiment of the invention.
Figure 10:
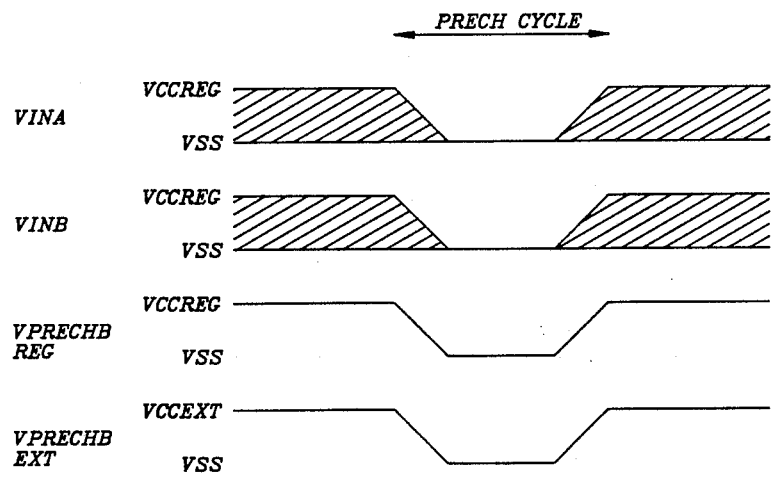
FIG. 10 shows the operation of the circuit of FIG. 9 in terms of operating voltages over time.

FIG. 9 shows another variation of synchronous circuitry. During the precharge cycle, Transistor Q8 will precharge $V_{Node\ A}$ to $V_{ccreg}$, and Transistor Q7 will precharge $V_{Node\ B}$ to $V_{ccext}$. Transistor Q8 receives regulated voltage as a precharge signal to precharge Node A. Isolating Transistor Q3 is controlled by $V_{ccreg}$. Transistor Q1 and Q2 are turned "off" during the precharge cycle. The timing of this circuit is shown in FIG. 10.

The preferred embodiments were developed for use with memory chips, such as DRAMs, SRAMs, FIFOs and the like. Accordingly, a variety of configurations are possible by using the inventive techniques. For another reason, the invention should be read as limited only by the appended

What is claimed is: claims.

1. In a circuit which provides a logic signal in high and low states, in which the low logic signal state approximates a common potential and the high state approximates a first high potential, an output circuit which provides high and low output signals for responding to said high and low logic signal states, with the low output signal approximating common potential and the high output signal approximating a second high potential, in which the difference between the potentials of the high and low output signals of the output circuit is greater than the difference in potentials between the high and low logic signal states, the circuit further comprising:

(a) a first inverter providing a first inverted output of the logic signal at a range of potentials approximating the high and low signals of the logic circuit, the first inverter circuit having power connections between a common potential and a regulated potential, the regulated potential approximating the first high potential;

(b) a second inverter having power connections between the common potential and external potential corresponding to the second high potential;

(c) an isolating transistor connecting the first and second inverters;

(d) means to conduct a high biasing potential to the second inverter in response to a low output of the second inverter, wherein a low level output of the first inverter initiates a low level signal provided through the isolating transistor to the second inverter and a high level output of the first inverter initiates a high level signal to the second inverter;

(e) the isolating transistor being biased to isolate the high level output of the first inverter from the second inverter after said initiation;

(f) a precharge signal generator responsive to a clocking signal and providing a predetermined biasing potential during a clock inactive signal;

(g) the isolating transistor being connected to gate current from an output of the first inverter to the input of the second inverter;

(h) the means to conduct the high biasing potential being an inverting transistor which is gated on by the low output of the second inverter and which gates current at a predetermined biasing potential to an input of the second inverter;

(i) a circuit responsive to the clocking signal to conduct the regulating potential to an output of the first inverter during the clock inactive cycle; and (j) a precharge biasing circuit, responsive to the predetermined biasing potential to gate the second high potential to the input to the second inverter during the clock inactive cycle of the clock in order to bias the input of the second inverter to a predetermined level prior to the gating on by the isolating transistor.

2. Circuit as described in claim 1, further comprising:
a precharge signal generator responsive to a clocking signal and providing a predetermined biasing potential to an input of the second inverter during a clock inactive signal;
the means to conduct the high biasing potential being transistor connected between the high biasing potential and the input of the second inverter which is gated on by the low output of the second inverter and which gates current at a predetermined biasing potential to the input of the second inverter; and
a precharge biasing circuit, responsive to the predetermined biasing potential to gate the second high potential to the input to the second inverter during the clock inactive cycle of the clock in order to bias the input of the second inverter to a predetermined level prior to the gating on by the isolating transistor.

3. Circuit as described in claim 1, further comprising:
the means to conduct the high biasing potential being an inverting transistor which is gated on by the low output of the second inverter and which gates current at the second high potential to an input of the second inverter.

4. Circuit as described in claim 3, further comprising:
the circuit being a portion of an addressable integrated circuit dynamic random access memory (DRAM) device.

5. CIrcuit as described in claim 4, further comprising:
the first inverter including first and second transistors, wherein a high level input signal gates off the first transistor and gates on the second transistor and a low level signal gates on the first transistor and gates off the second transistor;
the second inverter including third and fourth transistors, wherein a high level input signal gates off the third transistor and gates on the fourth transistor and a low level signal gates on the third transistor and gates off the fourth transistor; and
the isolating transistor being connected to gate current from an output of the first inverter to the input of the second inverter.

6. Circuit as described in claim 3, further comprising:
a precharge biasing circuit, responsive to a clock to conduct a precharge biasing potential to the input to the second inverter during a clock inactive cycle of the clock in order to bias the input of the second inverter to a predetermined level prior to the gating on by the isolating transistor.

7. In a circuit which provides a logic signal in high and low states, in which the low logic signal state approximates a common potential and the high state approximates a first high potential, an output circuit which provides high and low output signals for responding to said high and low logic signal states, with the low output signal approximating common potential and the high output signal approximating a second high potential, in which the difference between the potentials of the high and low output signals of the output circuit is greater than the difference in potentials between the high and low logic signal states, the circuit further comprising:
(a) a first inverter providing a first inverted output of the logic signal at a range of potentials approximating the high and low signals of the logic circuit, the first inverter circuit having power connections between a common potential and a regulated potential, the regulated potential approximating the first high potential;
(b) a second inverter having power connections between the common potential and external potential corresponding to the second high potential;
(c) an isolating transistor connecting the first and second inverters;
(d) means to conduct a high biasing potential to the second inverter in response to a low output of the second inverter, wherein a low level output of the first inverter initiates a low level signal provided through the isolating transistor to the second inverter and a high level output of the first inverter initiates a high level signal to the second inverter;
(e) the isolating transistor being biased to isolate the high level output of the first inverter from the second inverter after said initiation;
(f) the means to conduct the high biasing potential being an inverting transistor which is gated on by the low output of the second inverter and which gates current at the second high potential to an input of the second inverter;
(g) a precharge biasing circuit, responsive to a clock to conduct a precharge biasing potential to the input to the second inverter during a clock inactive cycle of the clock in order to bias the input of the second inverter to a predetermined level prior to the gating on by the isolating transistor.

8. In a circuit which provides a logic signal in high and low states, in which the low logic signal state approximates a common potential and the high state approximates a first high potential, an output circuit which provides high and low output signals for responding to said high and low logic signal states, with the low output signal approximating common potential and the high output signal approximating a second high potential, in which the difference between the potentials of the high and low output signals of the output circuit is greater than the difference in potentials between the high and low logic signal states, the circuit further comprising:
(a) a first inverter providing a first inverted output of the logic signal at a range of potentials approximating the high and low signals of the logic circuit, the first inverter circuit having power connections between a common potential and a regulated potential, the regulated potential approximating the first high potential;
(b) a second inverter having power connections between the common potential and external potential corresponding to the second high potential;
(c) an isolating transistor connecting the first and second inverters;
(d) means to conduct a high biasing potential to the second inverter in response to a low output of the second inverter, wherein a low level output of the first inverter initiates a low level signal provided through the isolating transistor to the second inverter and a high level output of the first inverter initiates a high level signal to the second inverter;
(e) the isolating transistor being biased to isolate the high level output of the first inverter from the second inverter after said initiation;
(f) a precharge signal generator responsive to a clocking signal and providing a predetermined biasing potential to an input of the second inverter during a clock inactive signal;

(g) the means to conduct the high biasing potential being transistor connected between the high biasing potential and the input of the second inverter which is gates on by the low output of the second inverter and which gates current at a predetermined biasing potential to the input of the second inverter; and (h) a precharge biasing circuit, responsive to the predetermined biasing potential to gate the second high potential to the input to the second inverter during the clock inactive cycle of the clock in order to bias the input of the second inverter to a predetermined level prior to the gating on by the isolating transistor.

* * * * *